United States Patent
Kurita et al.

(10) Patent No.: US 9,396,998 B2
(45) Date of Patent: Jul. 19, 2016

(54) SEMICONDUCTOR DEVICE HAVING FAN-IN AND FAN-OUT REDISTRIBUTION LAYERS

(71) Applicant: KABUSHIKI KAISHA TOSHIBA, Minato-ku, Tokyo (JP)

(72) Inventors: Yoichiro Kurita, Minato Tokyo (JP); Hirokazu Ezawa, Oota Tokyo (JP); Kazushige Kawasaki, Yokohama Kanagawa (JP); Satoshi Tsukiyama, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/479,078

(22) Filed: Sep. 5, 2014

(65) Prior Publication Data

US 2015/0262877 A1    Sep. 17, 2015

(30) Foreign Application Priority Data

Mar. 14, 2014   (JP) ................................. 2014-051235
Sep. 3, 2014    (JP) ................................. 2014-179002

(51) Int. Cl.
*H01L 21/768* (2006.01)
*H01L 23/00* (2006.01)
(Continued)

(52) U.S. Cl.
CPC ........ *H01L 21/76898* (2013.01); *H01L 23/481* (2013.01); *H01L 24/17* (2013.01); *H01L 24/92* (2013.01); *H01L 25/0657* (2013.01); *H01L 25/18* (2013.01); *H01L 25/50* (2013.01); *H01L 23/3128* (2013.01); *H01L 23/49816* (2013.01); *H01L 23/49827* (2013.01); *H01L 24/03* (2013.01); *H01L 24/11* (2013.01); *H01L 24/73* (2013.01); *H01L 24/81* (2013.01); *H01L 24/83* (2013.01); *H01L 2224/0401* (2013.01); *H01L 2224/05572* (2013.01);
(Continued)

(58) Field of Classification Search
CPC ............ H01L 21/7898; H01L 23/5386; H01L 21/76898; H01L 23/5384
See application file for complete search history.

(56) References Cited

U.S. PATENT DOCUMENTS 7,795,721 B2   9/2010   Kurita
8,349,649 B2   1/2013   Kurita
(Continued)

FOREIGN PATENT DOCUMENTS

JP   2010040721 A   2/2010
JP   2011243724 A   12/2011

OTHER PUBLICATIONS

Taiwanese Office Action (and English translation thereof) dated Jan. 12, 2016, issued in counterpart Taiwanese Application No. 103129544.

*Primary Examiner* — Tucker J Wright
(74) *Attorney, Agent, or Firm* — Holtz, Holtz & Volek PC

(57) ABSTRACT

According to one embodiment, the first resin layer is provided on the first face of the upper layer chip. The first interconnect layer is electrically connected to the upper layer chip. The second resin layer extends into a region outside chip. The region is outer side of a side face of the upper layer chip. The second interconnect layer is provided in the second resin layer. The second interconnect layer is connected to the first interconnect layer and extending into the region outside chip. The lower layer chip is mounted on the surface side of the first resin layer, and is connected to the first interconnect layer. The first sealing resin covers the upper layer chip.

21 Claims, 16 Drawing Sheets

(51) Int. Cl.
   H01L 23/48   (2006.01)
   H01L 25/18   (2006.01)
   H01L 25/00   (2006.01)
   H01L 25/065  (2006.01)
   H01L 23/31       (2006.01)
   H01L 23/498      (2006.01)

(52) U.S. Cl.
   CPC ........ *H01L 2224/06181* (2013.01); *H01L 2224/16146* (2013.01); *H01L 2224/16238* (2013.01); *H01L 2224/17051* (2013.01); *H01L 2224/17181* (2013.01); *H01L 2224/2919* (2013.01); *H01L 2224/32145* (2013.01); *H01L 2224/73104* (2013.01); *H01L 2224/73204* (2013.01); *H01L 2224/81005* (2013.01); *H01L 2224/81193* (2013.01); *H01L 2224/81203* (2013.01); *H01L 2224/81801* (2013.01); *H01L 2224/81986* (2013.01); *H01L 2224/83193* (2013.01); *H01L 2224/83203* (2013.01); *H01L 2224/83855* (2013.01); *H01L 2224/9202* (2013.01); *H01L 2224/97* (2013.01); *H01L 2225/06513* (2013.01); *H01L 2225/06541* (2013.01); *H01L 2924/00014* (2013.01); *H01L 2924/10253* (2013.01); *H01L 2924/12042* (2013.01); *H01L 2924/1431* (2013.01); *H01L 2924/1434* (2013.01); *H01L 2924/301* (2013.01); *H01L 2924/381* (2013.01)

(56)   References Cited

U.S. PATENT DOCUMENTS

| | | | | |
|---|---|---|---|---|
| 2006/0063312 | A1* | 3/2006 | Kurita | H01L 21/563 438/127 |
| 2006/0226556 | A1* | 10/2006 | Kurita | H01L 21/563 257/778 |
| 2007/0086166 | A1* | 4/2007 | Kurita | H01L 21/4853 361/704 |
| 2008/0079163 | A1* | 4/2008 | Kurita | H01L 21/6835 257/759 |
| 2011/0089573 | A1* | 4/2011 | Kurita | H01L 23/3121 257/774 |

* cited by examiner

SEMICONDUCTOR DEVICE HAVING FAN-IN AND FAN-OUT REDISTRIBUTION LAYERS

CROSS-REFERENCE TO RELATED APPLICATIONS

This application is based upon and claims the benefit of priority from Japanese Patent Application No. 2014-051235, filed on Mar. 14, 2014, and Japanese Patent Application No. 2014-179002, filed on Sep. 3, 2014; the entire contents of all of which are incorporated herein by reference.

FIELD

Embodiments described herein relate generally to a semiconductor device and a method for manufacturing the same.

BACKGROUND

A package structure is known in which a stacked body of a plurality of chips connected by a through-silicon via (TSV) is bump connected to a wiring substrate. In this type of structure, a structure in which an interface chip for a plurality of memory chips is connected by a TSV has also been proposed.

DETAILED DESCRIPTION

Figure 1:
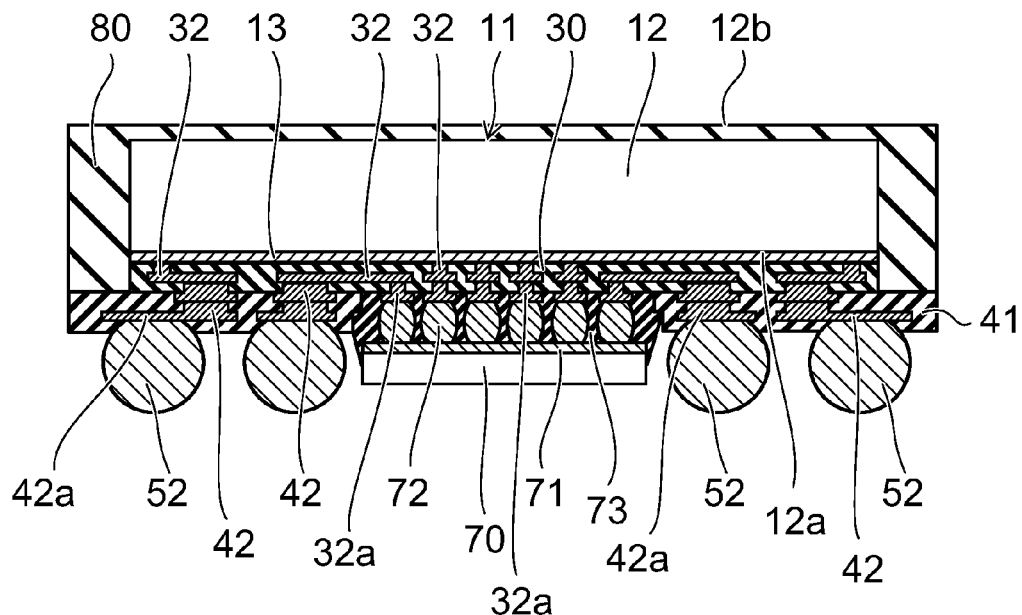
FIG. 1 is a schematic cross-sectional view of a semiconductor device of an embodiment.

According to one embodiment, a semiconductor device includes an upper layer chip, a first resin layer, a first interconnect layer, a second resin layer, a second interconnect layer, a lower layer chip, and a first sealing resin. The upper layer chip has a first face and a second face opposite to the first face. The first resin layer is provided on the first face of the upper layer chip. The first interconnect layer is provided in the first resin layer. The first interconnect layer is electrically connected to the upper layer chip. The second resin layer is provided on a surface side of the first resin layer. The second resin layer extends into a region outside chip. The region is outer side of a side face of the upper layer chip. The second interconnect layer is provided in the second resin layer. The second interconnect layer is connected to the first interconnect layer and extending into the region outside chip. The lower layer chip is mounted on the surface side of the first resin layer, and is connected to the first interconnect layer. The first sealing resin covers the upper layer chip.

Embodiments will be described below with reference to drawings. Note that the same reference numerals are applied for the same elements in each drawing.

FIG. 1 is a schematic cross-sectional view of a semiconductor device according to an embodiment.

The semiconductor device according to the embodiment includes an upper layer chip, and an interconnect structure part for connecting the upper layer chip to an external circuit. The upper layer chip includes, for example, a memory chip.

In the example illustrated in FIG. 1, the upper layer chip includes a single memory chip 11. The memory chip 11 includes a semiconductor layer 12.

The semiconductor layer 12 is, for example, a silicon substrate. Alternatively, the semiconductor layer 12 is a silicon layer in a silicon on insulator (SOI) structure. Also, besides silicon, the semiconductor layer 12 may be, for example, a SiC, GaN layer (substrate) and the like. In the following description, the semiconductor layer 12 is described as a silicon substrate.

The silicon substrate 12 includes a first face (circuit face) 12a and a second face 12b opposite to the first face 12a. A semiconductor integrated circuit that includes transistors and the like not illustrated on the drawings is formed on the first face 12a. A charge storage layer, a control electrode, and the like, are formed on the first face 12a. Also, an on-chip interconnect layer 13 connected to the semiconductor integrated circuit and the control electrode is provided on the first face 12a.

Figure 3A:
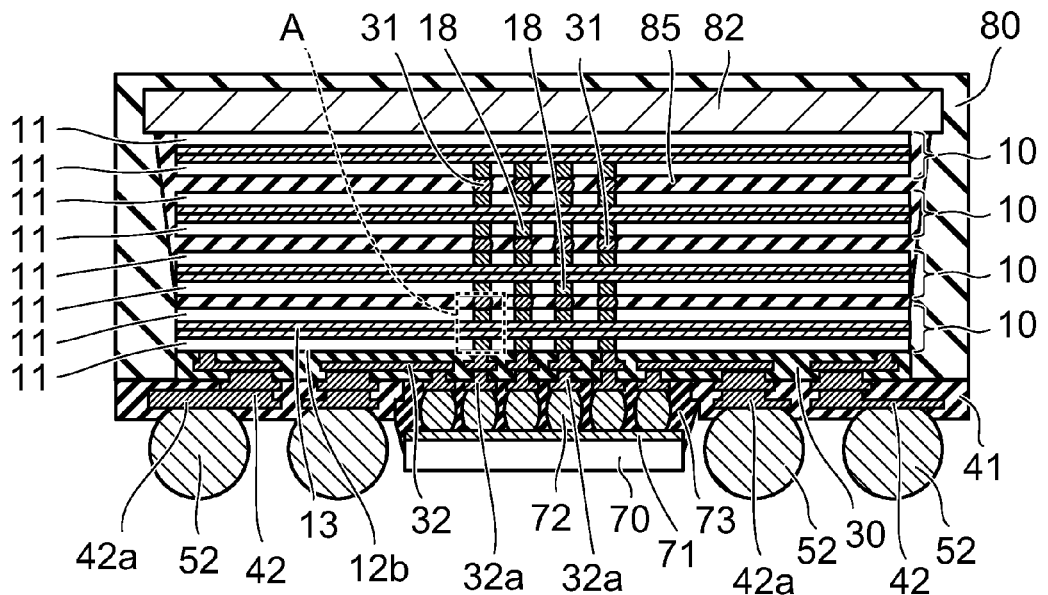
FIGS. 3A and 3B are schematic cross-sectional views of a semiconductor device of the embodiment.
Figure 3B:
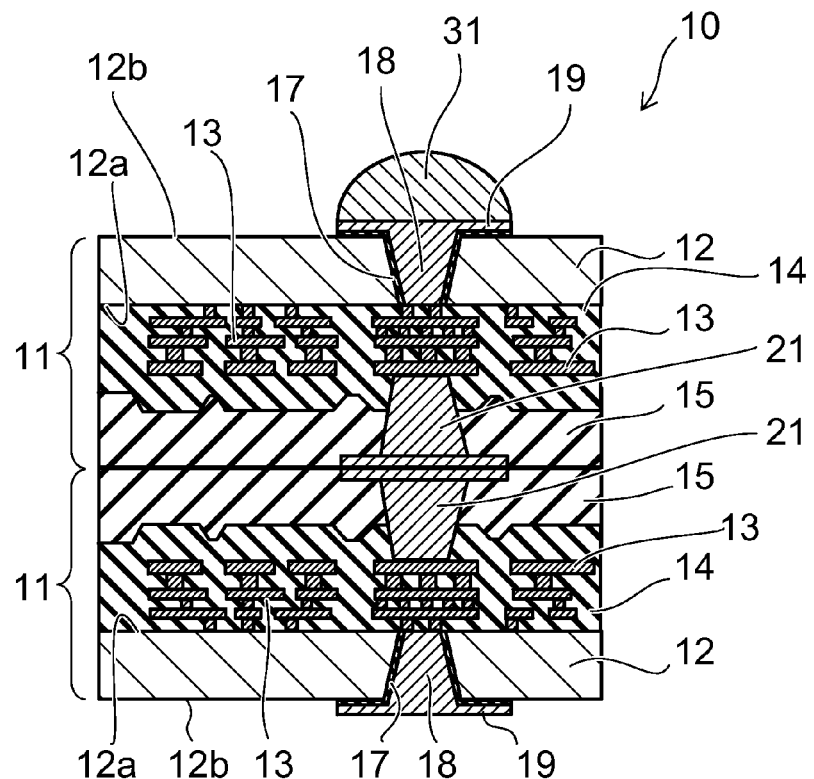

For example, as illustrated in FIG. 3B which is described later, an inter-layer insulating layer 14 is provided between the on-chip interconnect layer 13 and the first face 12a, between on-chip interconnect layers 13, and on the topmost layer of on-chip interconnect layer 13.

The inter-layer insulating layer 14 is an insulating film with silicon as the main component, and includes, for example, at least one of silicon oxide (SiO), silicon nitride (SiN), silicon oxynitride (SiON), silicon carbonitride (SiCN), and silicon oxycarbide (SiOC).

A first resin layer 30 is provided on the first face 12a side of the memory chip 11. The first resin layer 30 is provided covering the surface of the on-chip interconnect layer 13 of the memory chip 11.

A first interconnect layer 32 is provided within the first resin layer 30 and on the surface side of the first resin layer 30. The first interconnect layer 32 penetrates the first resin layer 30 and is connected to the on-chip interconnect layer 13 of the memory chip 11. Therefore, the first interconnect layer 32 is electrically connected to the memory chip 11. The first resin layer 30 insulates between first interconnect layers 32. The first interconnect unit includes the first resin layer 30 and the first interconnect layer 32.

The first resin layer 30 and the first interconnect layer 32 are provided in a region opposite the first face 12a of the memory chip 11, and are not formed in regions outside the chip (regions to the outer side of the side face of the memory chip 11). The first interconnect layer 32 is a so-called fan-in redistribution layer (RDL) drawn into a region that overlaps with the chip.

A second resin layer 41 is provided on the surface side of the first resin layer 30. The second resin layer 41 is formed extending from a region opposite the first face 12a of the memory chip 11 to a region outside the chip on the outer side of a side face of the memory chip 11.

A second interconnect layer 42 is provided within the second resin layer 41 and on the surface side of the second resin layer 41. The second interconnect layer 42 is connected to the first interconnect layer 32, and is formed extending to a region outside the chip. The second interconnect layer 42 is a so-called fan out redistribution layer (RDL). The second resin layer 41 insulates between second interconnect layers 42. The second interconnect unit includes the second resin layer 41 and the second interconnect layer 42.

The first interconnect layer 32 and the second interconnect layer 42 are made from, for example, a metal material that includes copper as the main component.

The first resin layer 30 and the second resin layer 41 are constituted mainly from an organic polymer material with a carbon skeleton and, for example, polyimide resin, polybenzo oxazole (PBO) resin, epoxy resin, silicone resin, or benzocyclobutene (BCB) resin are included as the main component.

A plurality of external terminals 52 is disposed on the surface side of the second resin layer 41. The external terminals 52 are conductive bumps such as, for example, solder balls, metal bumps, or the like. The external terminals 52 are connected to the second interconnect layer 42.

The semiconductor integrated circuit and the memory elements formed in the memory chip 11 are electrically connected to the second interconnect layer 42 via the on-chip interconnect layer 13 and the first interconnect layer 32. Also, the memory chip 11 can be connected to an external circuit via the external terminals 52 connected to the second interconnect layer 42.

The side face and the second face (top face) 12b of the memory chip 11 are covered with sealing resin (first sealing resin) 80. The sealing resin 80 covers the side face of the memory chip 11 and the side face of the first resin layer 30 above the second resin layer 41 which extends into the region outside the chip.

Also, according to this embodiment, in addition to the memory chip 11, a logic chip 70 is provided as a lower layer chip. The logic chip 70 is mounted on the surface side of the first resin layer 30 (the face on the side opposite the face connected to the on-chip interconnect layer 13), and is connected to the first interconnect layer 32. In other words, the memory chip 11 is mounted as an upper layer chip on a first face of the first resin layer 30, and the logic chip 70 is mounted as a lower layer chip on a second face of the first resin layer 30. Here, "upper layer" and "lower layer" represent the relative positional relationship sandwiching the first resin layer 30, and does not mean the top and bottom with respect to the gravitational direction.

The logic chip 70 is an interface (IF)/controller chip that controls the memory chip 11.

An on-chip interconnect layer 71 is provided on the first face of the logic chip 70, and the on-chip interconnect layer 71 is connected to a connection land 32a of the first interconnect layer 32 via a conductive bump (for example, a solder ball, a metal bump, or the like) 72.

The second resin layer 41 is not formed on the whole surface of the first resin layer 30. On the face of the first resin layer 30 on the side opposite the face that is connected to the memory chip 11, there is a region (opening) where the second resin layer 41 and the second interconnect layer 42 are not formed, and the logic chip 70 is disposed in that region (opening). This opening is filled with sealing resin 73 so as to cover the junction of the bumps 72 with the connection land 32a of the first interconnect layer 32.

The plurality of connection lands 32a of the first interconnect layer 32 is disposed on the mounting face of the logic chip 70 in the first resin layer 30 at substantially the same pitch as the pitch of the junction of the on-chip interconnect layer 13 with the first interconnect layer 32.

The minimum pitch (pitch of the bumps 72) of the connection between the logic chip 70 and the connection lands 32a of the first interconnect layer 32 is smaller than the minimum pitch of the connection between the external connection lands 42a of the second interconnect layer 42 and the external terminals 52. Also, the minimum pitch of the connection between the logic chip 70 and the first interconnect layer 32 is smaller than the minimum pitch of the connection between the first interconnect layer 32 and the second interconnect layer 42.

The first interconnect layer 32 includes a narrow pitch land corresponding to the fine wiring design of the memory chip 11 and the on-chip interconnect layers 13, 71 of the logic chip 70, and a land that is laid out corresponding to the pitch of the external terminals 52 (connections to the second interconnect layer 42).

In other words, the chip level fine pitch electrode pad in the memory chip 11 and the logic chip 70 is enlarged to a pitch suitable for mounting on a printed circuit board or the like via the first interconnect layer 32 and the second interconnect layer 42.

The logic chip 70 is disposed in the region underneath the memory chip 11, and is bump connected to the memory chip 11 via the first interconnect layer 32. Also, the logic chip 70 is electrically connected to the external terminals 52 via the first interconnect layer 32 and the second interconnect layer 42. The logic chip 70 and the second interconnect layer 42 that serves as the connection to the outside are provided on the same face of the first resin layer 30.

The structure is not one in which the logic chip is sandwiched between a printed wiring board (interposer substrate) and a memory chip. Therefore, a TSV (through electrode) need not be used for connecting the logic chip 70 to both the memory chip 11 and external circuits. Therefore, according to this embodiment, a low-cost high reliability semiconductor device can be provided.

Figure 2:
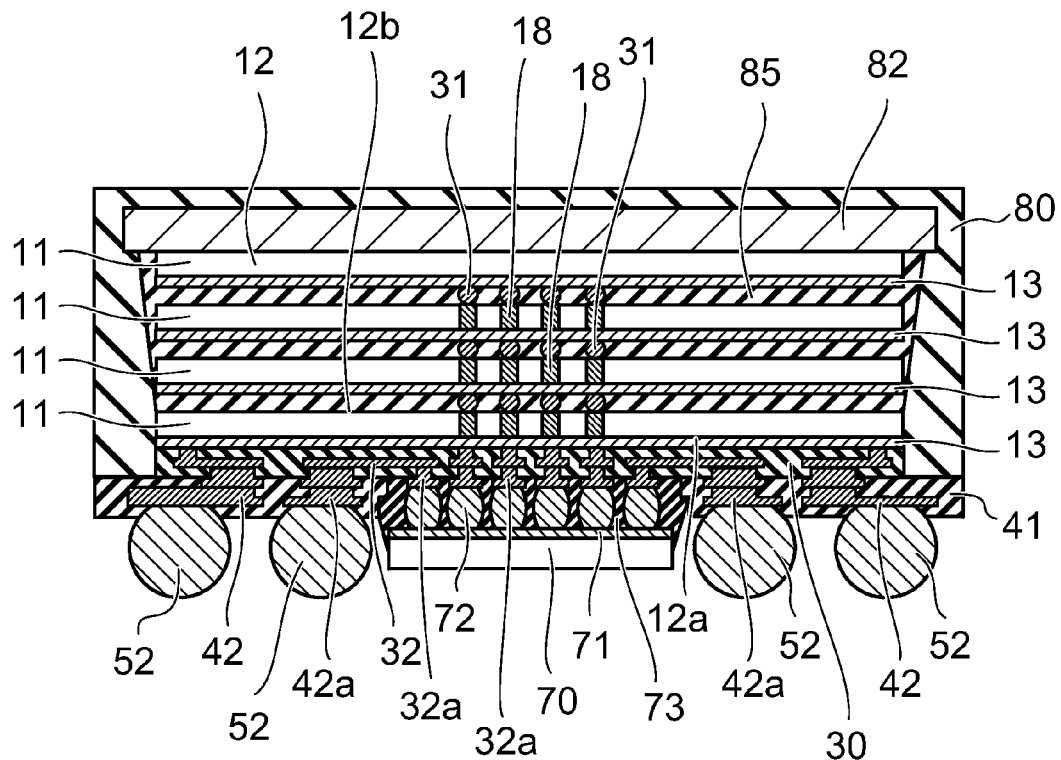
FIG. 2 is a schematic cross-sectional view of a semiconductor device of the embodiment.

FIG. 2 is a schematic cross-sectional view illustrating another example of semiconductor device according to the embodiment.

In the example illustrated in FIG. 2, the memory chip portion includes a stacked body of a plurality of memory chips 11. In FIG. 2, a structure in which, for example, four memory chips 11 are stacked is illustrated, but the number of stacked layers of memory chips 11 is arbitrary. The plurality of memory chips 11 includes chips that are the same in terms of thickness, plan size, layer structure in the thickness direction, material, and the like.

An on-chip interconnect layer 13 is provided on the first face 12a of each of the memory chips 11, the same as in the embodiment described above.

The memory chips 11 are electrically connected to each other via through electrodes 18 and bumps (for example, solder balls, metal bumps) 31.

The through electrodes 18 pass through the silicon substrate 12, and connect the on-chip interconnect layer 13 formed on the first face 12a to a reverse side electrode formed on the second face 12b.

The memory chips 11 other than the memory chip 11 closest to the first resin layer 30 side (lowermost layer) are stacked on the memory chip 11 below with their on-chip interconnect layer 13 opposite the second face 12b of the memory chip 11 below.

The bumps 31 are interposed between the reverse side electrodes (through electrodes 18) of the lower memory chips 11, and the on-chip interconnect layers 13 of the upper memory chips 11, and are connected to the reverse side electrodes of the lower memory chips 11 and the on-chip interconnect layers 13 of the upper memory chips 11.

Sealing resin (second sealing resin) 85 is filled between memory chip 11 and memory chip 11, and the sealing resin 85 covers around the bumps 31.

A metal plate 82 is provided on the topmost layer memory chip 11 furthest from the first resin layer 30. As discussed later, the metal plate 82 is used as a support member when stacking the plurality of memory chips 11 and first resin layer 30. Ultimately, the metal plate 82 may be removed. Also, if the metal plate 82 remains, the metal plate 82 functions as a heat dissipation plate.

The first resin layer 30, the first interconnect layer 32, the second resin layer 41, the second interconnect layer 42, the logic chip 70, and the external terminals 52 are provided on the on-chip interconnect layer 13 side of the bottommost layer memory chip 11, in the same way as for the embodiment described above.

The semiconductor integrated circuit or memory element formed in each of the memory chips 11 is electrically connected to the second interconnect layer 42 via the on-chip interconnect layer 13 and the first interconnect layer 32. Also, each of the memory chips 11 can be connected to external circuits via the external terminals 52 connected to the second interconnect layer 42.

The side faces and top face of the stacked body of the plurality of memory chips 11 is covered with sealing resin 80. Also, the metal plate 82 is covered with the sealing resin 80.

In the structure illustrated in FIG. 2 also, the chip level fine pitch electrode pad in the memory chips 11 and the logic chip 70 is expanded to a pitch appropriate for mounting on a printed circuit board or the like, via the first interconnect layer 32 and the second interconnect layer 42.

Also, the logic chip 70 is disposed in a region directly below the stacked body of memory chips 11, and is bump connected to the stacked body of memory chips 11 via the first interconnect layer 32. Also, the logic chip 70 is electrically connected to the external terminals 52 via the first interconnect layer 32 and the second interconnect layer 42. The logic chip 70 and the second interconnect layer 42 that serves as the connection to the outside are provided on the same face of the first resin layer 30.

Therefore, a TSV (through electrode) also need not be used for connecting the logic chip 70 to both the memory chips 11 and external circuits in the structure illustrated in FIG. 2. Therefore, a low-cost high reliability semiconductor device can be provided.

FIG. 3A is a schematic cross-sectional view illustrating yet another example of semiconductor device according to the embodiment.

In the example illustrated in FIG. 3A, a memory chip portion includes a stacked body of a plurality of memory chips 11. Also, a plurality of two chip stacked bodies 10, configured by arranging the circuit faces 12a of two memory chips 11 in opposition face to face and bonding, is stacked.

In the two chip stacked bodies 10, a pair of memory chips 11 is bonded by bonding wafer to wafer as described later. The plurality of two chip stacked bodies 10 is bump connected together.

FIG. 3B is an enlarged schematic cross-sectional view of the portion A in FIG. 3A, illustrating the cross-section of the main portion of a two chip stacked body 10.

Each of the memory chips 11 includes a silicon substrate (semiconductor layer) 12, an on-chip interconnect layer 13, a through electrode 18, and bonding metal (intermediate electrode) 21.

An on-chip interconnect layer 13 connected to a semiconductor integrated circuit and control electrode is provided on the circuit face 12a. Multilayer interconnect is illustrated in FIG. 3B, but the on-chip interconnect layer 13 may be a single layer. The inter-layer insulating layer 14 is provided between the on-chip interconnect layer 13 and the circuit face 12a, between on-chip interconnect layers 13, and on the topmost layer of on-chip interconnect layer 13.

A resin layer 15 is provided on the surface of the inter-layer insulating layer 14. The resin layer 15 is, for example, benzocyclobutene (BCB) resin. Alternatively, the resin layer 15 is polyimide resin, or epoxy resin.

Through electrodes 18 are provided in the silicon substrate 12. Also, a reverse side electrode 19 is provided on the reverse side 12b of the silicon substrate 12. The through electrodes 18 penetrate the silicon substrate 12 at the positions where the reverse side electrodes 19 are formed, and connect the reverse side electrodes 19 and the on-chip interconnect layer 13. The through electrodes 18 are made from, for example, a metal that includes copper as the main component.

An insulating film 17 is provided between the through electrodes 18 and the silicon substrate 12, to prevent direct electrical connection between the through electrodes 18 and the silicon substrate 12. The insulating film 17 is, for example, a silicon oxide film, a silicon nitride film, or a silicon oxonitride film.

The bonding metal (or intermediate electrode) 21 is buried in the resin layer 15. The bonding metal 21 penetrates the resin layer 15 and a portion of the inter-layer insulating layer 14, and is connected to the on-chip interconnect layer 13. The bonding metal 21 is made from, for example, a metal that includes copper as the main component.

The two chip stacked bodies 10 are formed by placing the circuit faces 12a (on-chip interconnect layer 13) of the memory chips 11 in opposition and bonding them in this manner. The bonding metal 21 of the memory chips 11 are bonded together, and the resin layers 15 are bonded together.

In FIG. 3A, in two sets of two chip stacked bodies 10 that are adjacent in the stacking direction, the bumps 31 are provided between the reverse side electrodes 19 of the memory chip 11 on the upper side of the lower two chip stacked body 10 and the reverse side electrode 19 of the memory chip 11 on the lower side of the upper two chip stacked body 10. The bumps 31 are, for example, solder balls or metal bumps that connect together the reverse side electrodes 19 of the upper and lower memory chips 11.

The first resin layer 30, the first interconnect layer 32, the second resin layer 41, the second interconnect layer 42, the logic chip 70, and the external terminals 52 are provided on the reverse side 12b side of the memory chip 11 on the lower side of the lowermost two chip stacked body 10, in the same way as for the embodiment described above.

The semiconductor integrated circuit or memory element formed in each memory chip 11 is electrically connected to the second interconnect layer 42 via the on-chip interconnect layer 13 and the first interconnect layer 32. Then, each memory chip 11 can be connected to external circuits via the external terminals 52 connected to the second interconnect layer 42.

The side faces and top face of the stacked body of the plurality of memory chips 11 is covered with the sealing resin 80. Also, the metal plate 82 is covered with the sealing resin 80.

In the structure illustrated in FIG. 3A also, the chip level fine pitch electrode pad in the memory chips 11 and the logic chip 70 is expanded to a pitch appropriate for mounting on a printed circuit board or the like, via the first interconnect layer 32 and the second interconnect layer 42.

Also, the logic chip 70 is disposed in a region directly below the stacked body of memory chips 11, and is bump connected to the stacked body of memory chips 11 via the first interconnect layer 32. Also, the logic chip 70 is electrically connected to the external terminals 52 via the first interconnect layer 32 and the second interconnect layer 42. The logic chip 70 and the second interconnect layer 42 that serves as the connection to the outside are provided on the same face of the first resin layer 30.

Therefore, in the structure illustrated in FIG. 3A also, a TSV (through electrode) need not be used for connecting the logic chip 70 to both the memory chips 11 and external circuits. Therefore, a low-cost high reliability semiconductor device can be provided.

Next, a method of manufacturing the two chip stacked body 10 is described with reference to FIGS. 9 to 14. The processes illustrated in FIGS. 9 to 14 are carried out in a wafer form, and FIGS. 9 to 14 illustrate a portion of a cross-section of wafers W1, W2.

First, the elements as described above (semiconductor integrated circuit, memory element, on-chip interconnect layer 13, inter-layer insulating layer 14, resin layer 15, bonding metal 21) are formed on the silicon substrate 12 using wafer processes. Then, the two wafers W1, W2 are attached with the circuit faces 12a side opposite each other.

Figure 9:
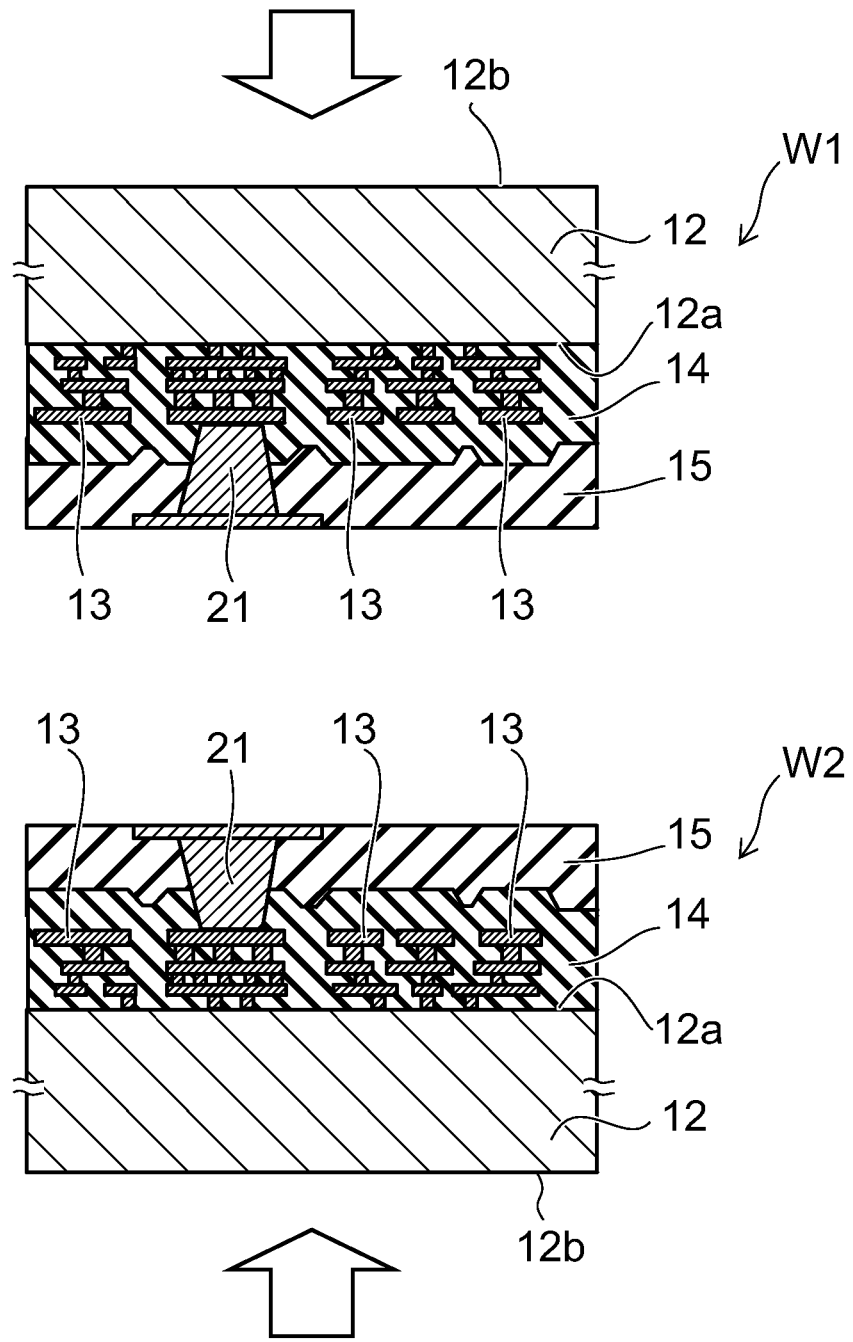

FIG. 9 illustrates a first wafer W1 and a second wafer W2 before attaching. The first wafer W1 and the second wafer W2 have the same structure, and each element has mirror image symmetry sandwiching the plane of attachment.

Figure 10:
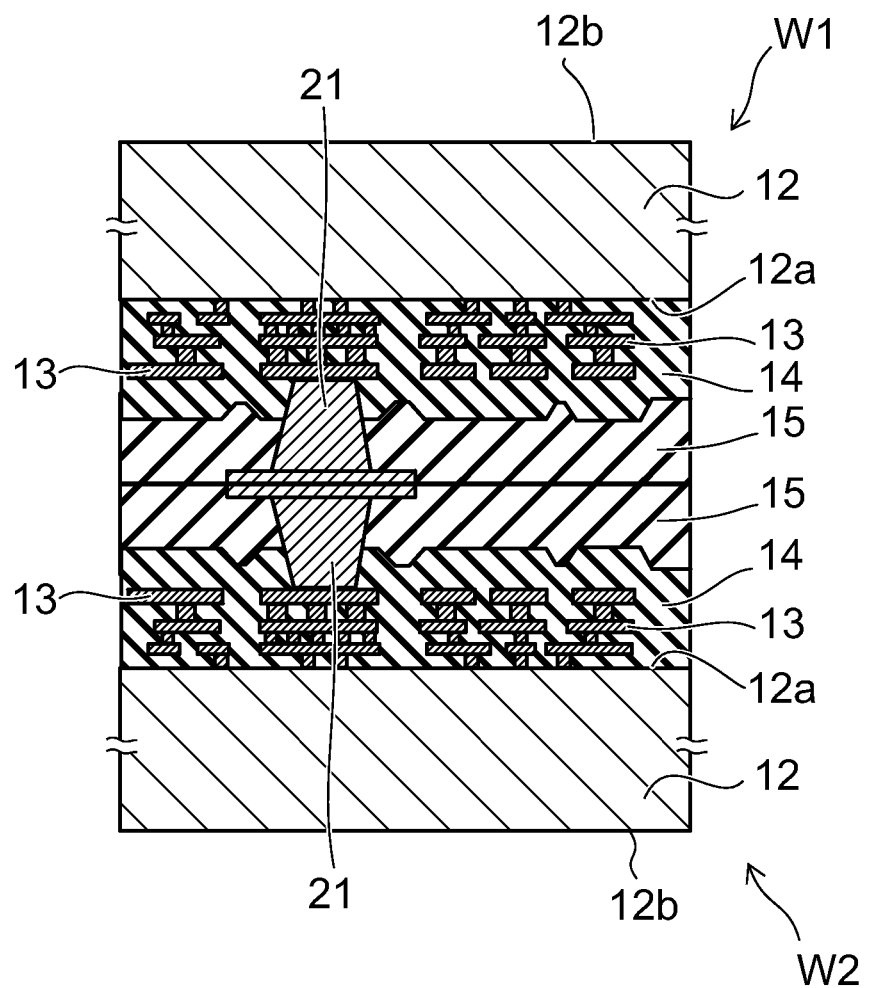

The first wafer W1 and the second wafer W2 are superimposed as illustrated in FIG. 10, and the positions of the bonding metal 21 are aligned corresponding to each other. The two wafers W1, W2 are attached under pressure and heat, the bonding metals 21 are bonded to each other, and the resin layers 15 are bonded to each other.

Figure 11:
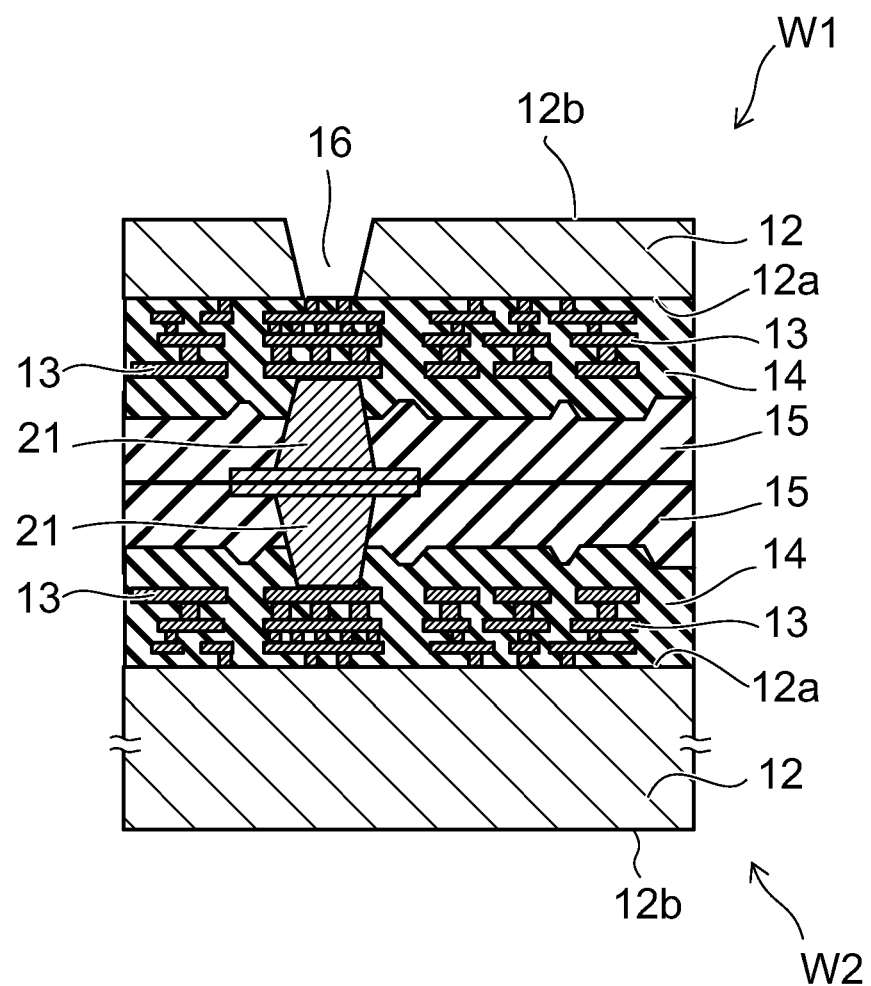

After bonding the wafers, grinding is carried out from the reverse side 12b side of the silicon substrate 12 of the first wafer W1 to reduce the thickness, as illustrated in FIG. 11. Even though the silicon substrate 12 of the first wafer W1 becomes thin, the silicon substrate 12 of the second wafer W2 acts as a support body. Alternatively, grinding may be carried out on the silicon substrate 12 of the second wafer W2 first to reduce its thickness, with the silicon substrate 12 of the first wafer W1 as support body.

The silicon substrate 12 before grinding is, for example, not less than 700 μm, and as a result of grinding, the thickness of the silicon substrate 12 is reduced to, for example, approximately from 30 to 50 μm if the through electrode is formed, and approximately from 100 to 500 μm, for example, if the through electrode is not formed.

After the thickness of the silicon substrate 12 of the first wafer W1 has been reduced, a via 16 is formed penetrating the silicon substrate 12 and reaching the interconnect layer 13 of the first wafer W1, as illustrated in FIG. 11. For example, the via 16 is formed by etching such as reactive ion etching (RIE).

Figure 12:
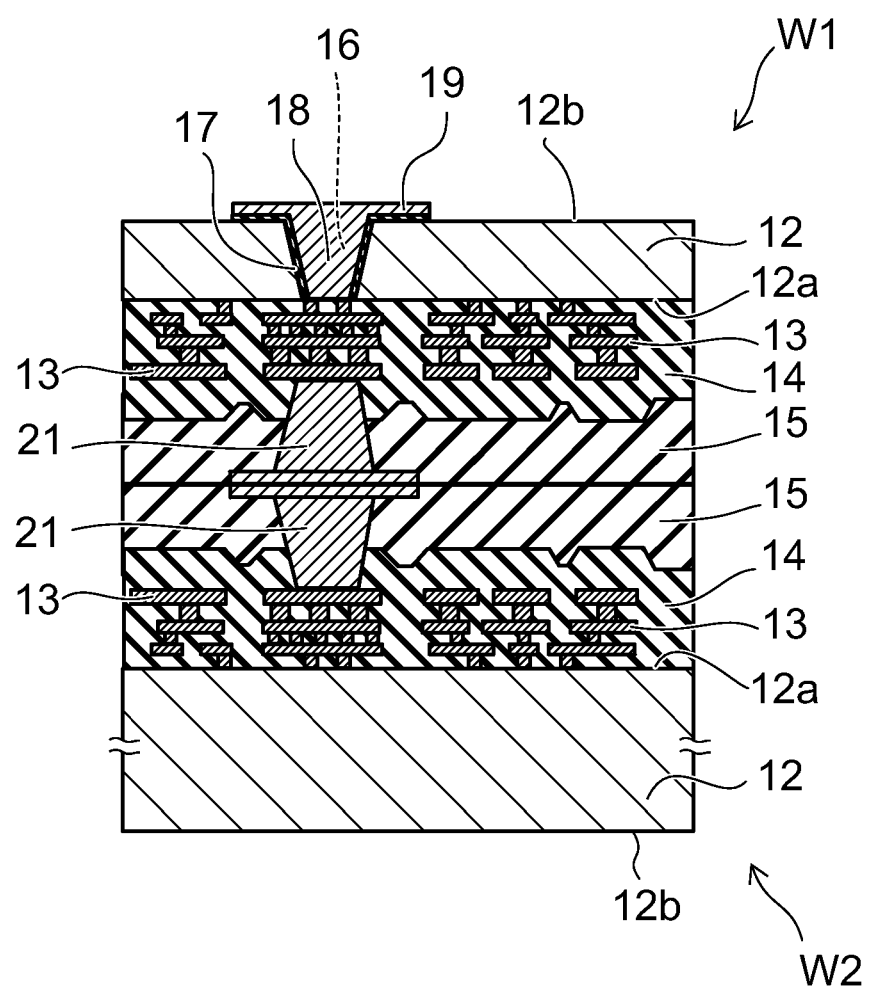

As illustrated in FIG. 12, the insulating film 17 is formed on the inner walls of the via 16, and on the reverse side 12b of the silicon substrate 12 around the via 16. Then, the through electrode 18 is buried in the via 16 via the insulating film 17. Also, the reverse side electrode 19 connected to the through electrode 18 is formed on the reverse side 12b of the silicon substrate 12. The insulating film 17 is also interposed between the reverse side electrode 19 and the reverse side 12b of the silicon substrate 12.

Figure 13:
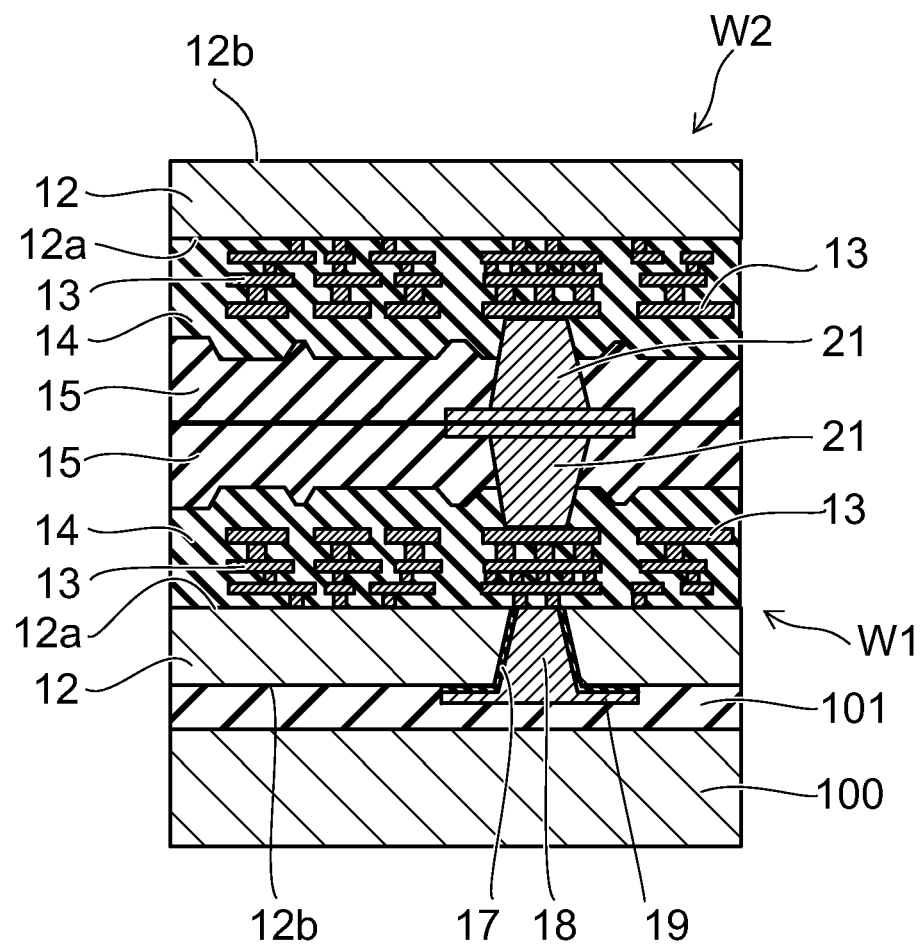

Next, as illustrated in FIG. 13, a support body 100 is attached to the reverse side 12b side of the silicon substrate 12 of the first wafer W1 in which the through electrode 18 is formed. In FIG. 13, the first wafer W1 and the second wafer W2 are illustrated with top and bottom reversed relative to FIG. 12.

The support body 100 is, for example, a rigid body such as a glass substrate or the like. The support body 100 is attached to the silicon substrate 12 of the first wafer W1 via an adhesive layer 101.

With the first wafer W1 and the second wafer W2 supported by the support body 100, the reverse side 12b side of the silicon substrate 12 of the second wafer W2 is ground to reduce its thickness.

After the thickness of the silicon substrate 12 of the second wafer W2 has been reduced, a via is formed penetrating the silicon substrate 12 and reaching the interconnect layer 13 of the second wafer W2, using the same process as for the first wafer W1.

Figure 14:
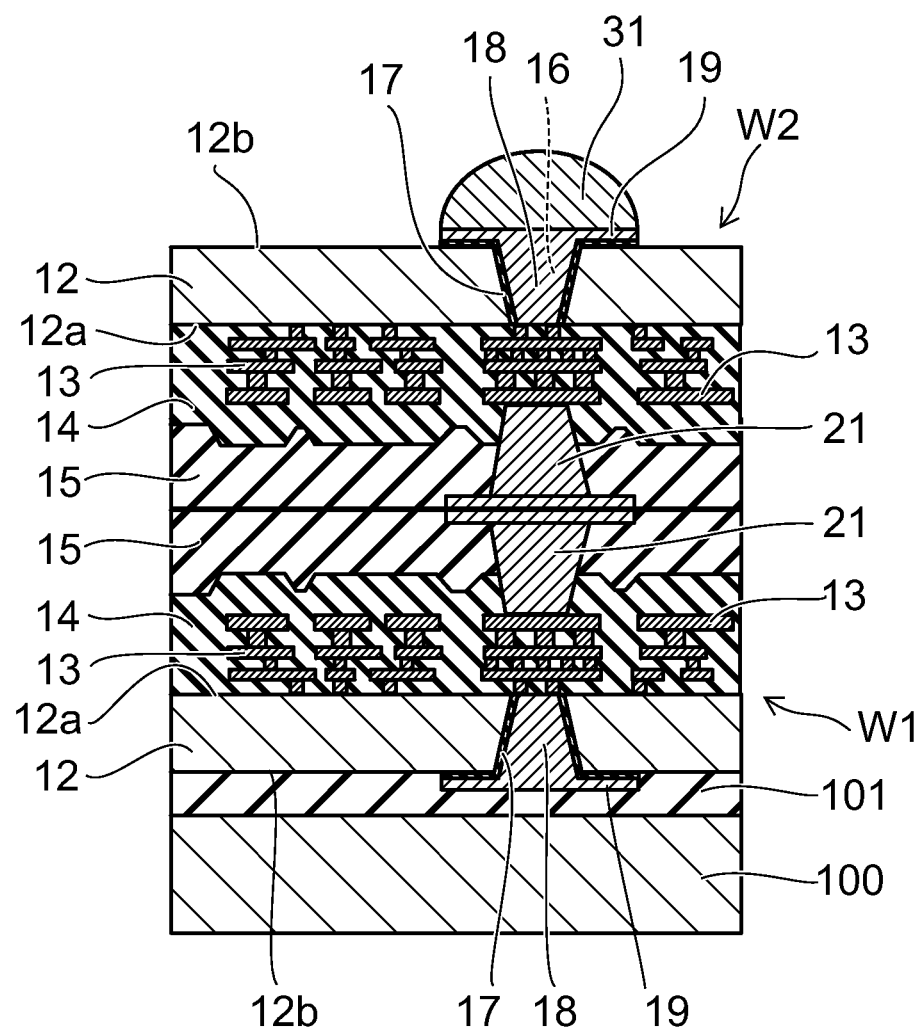

Then, as illustrated in FIG. 14, the insulating film 17 is formed on the inner walls of the via 16 of the second wafer W2, and on the reverse side 12b of the silicon substrate 12 around the via 16. Then, the through electrode 18 is buried in the via 16 with the insulating film 17. Also, the reverse side electrode 19 connected to the through electrode 18 is formed on the reverse side 12b of the silicon substrate 12. The insulating film 17 is also interposed between the reverse side electrode 19 and the reverse side 12b of the silicon substrate 12. Also, if necessary, the bumps 31 are formed on the reverse side electrodes 19.

Then, the bonded body of the first wafer W1 and the second wafer W2 is diced, and by removing (peeling) the support body 100, the individual two chip stacked bodies 10 can be obtained.

For example, the second wafer W2 and the first wafer W1 are diced with the support body attached to a dicing tape. Alternatively, the second wafer W2 and the first wafer W1 may be diced after the support body has been peeled.

The two chip stacked bodies 10 of this embodiment are obtained by dicing after wafer to wafer bonding, not by bonding the two individual chips chip to chip. Therefore, the two chip stacked bodies 10 are formed in a cuboidal shape having continuous side faces.

The separated plurality of two chip stacked bodies 10 is stacked on the metal plate 82 as described previously, and the sealing resin (second sealing resin) 85 is filled between the plurality of two chip stacked bodies 10.

Alternatively, the plurality of two chip stacked bodies 10 may be stacked by attaching them with resin adhesive layer formed on their surfaces in advance.

In the through silicon via (TSV) structure, if the substrate is made thinner the surface area of the through electrode become smaller, so the parasitic capacitance between the through electrode and substrate that are in opposition with the insulating film sandwiched therebetween can be reduced. However, when the substrate is made thinner, the problem arises that handling becomes difficult when bonding chips together, bonding chips to mounting substrates, and in other assembly processes.

Therefore, according to the embodiment as described above, after placing the circuit face 12a sides of the two wafers W1, W2 in opposition and bonding them wafer to wafer, the silicon substrate 12 of one of the wafers W2 is used as a support body, and the silicon substrate 12 of the other wafer W1 is made thinner and the through electrodes 18 are formed. Then, after applying a support body (rigid body) 100 to the silicon substrate 12 side of the first wafer W1, the silicon substrate 12 of the second wafer W2 is made thinner, and the through electrodes 18 are also formed in the wafer W2.

Therefore, the TSV structure can be formed after reducing the thickness of each of the two chip stacked bodies 10, without handling difficulties. As a reference example, according to the two chip stacked bodies 10 of this embodiment, it is possible to reduce the thickness of the substrates 12 by approximately ½, compared with the structure in which two chips are stacked chip to chip.

Therefore, it is possible to reduce the surface area of the through electrodes 18 in opposition to the silicon substrate 12 sandwiching the insulating film 17 by approximately ½ compared with the reference example, so it is possible to reduce the parasitic capacitance between the through electrodes 18 and the substrate 12 by approximately ½.

In particular, as the number of layers of stacking memory chips 11 increases associated with the increase in memory capacity, the number of TSVs also increases, so the effect of their parasitic capacitance tends to increase, but according to this embodiment, by reducing the parasitic capacitance of the TSVs by reducing the thickness of the substrates 12, the electrical power consumption is reduced as a result.

Also, the two chip stacked bodies 10 is configured by bonding the same memory chips 11 with the cross-section structure of mirror image symmetry through the attachment face, so the warping that occurs in each of the memory chips 11 is canceled out, and it is possible to obtain two chip stacked bodies 10 with little warping.

Figure 4:
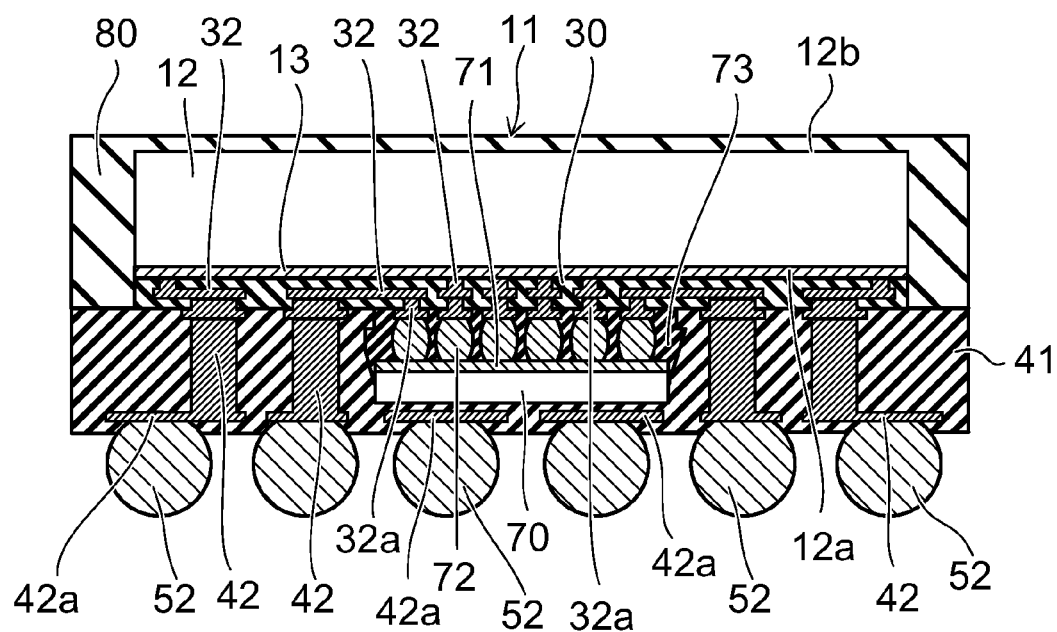
FIG. 4 is a schematic cross-sectional view of a semiconductor device of the embodiment.

FIG. 4 is a schematic cross-sectional view illustrating yet another example of semiconductor device according to an embodiment.

The structure of FIG. 4 differs from the structure of FIG. 1 in that the second resin layer 41 covers the logic chip 70.

The top face of the logic chip 70 (the face on the side opposite the on-chip interconnect layer 71) is covered by the second resin layer 41. The external connection lands 42a of the second interconnect layer 42 are also provided in the second resin layer 41 which covers the top face of the logic chip 70. The external terminals 52 are connected to the external connection lands 42a. In other words, the external terminals 52 are also disposed in the region where the logic chip 70 is mounted.

By broadening the region where the external terminals 52 can be disposed, it is possible to increase the pitch between the external terminals 52, reliably prevent short-circuits between terminals, and improve the mounting operability.

Figure 5A:
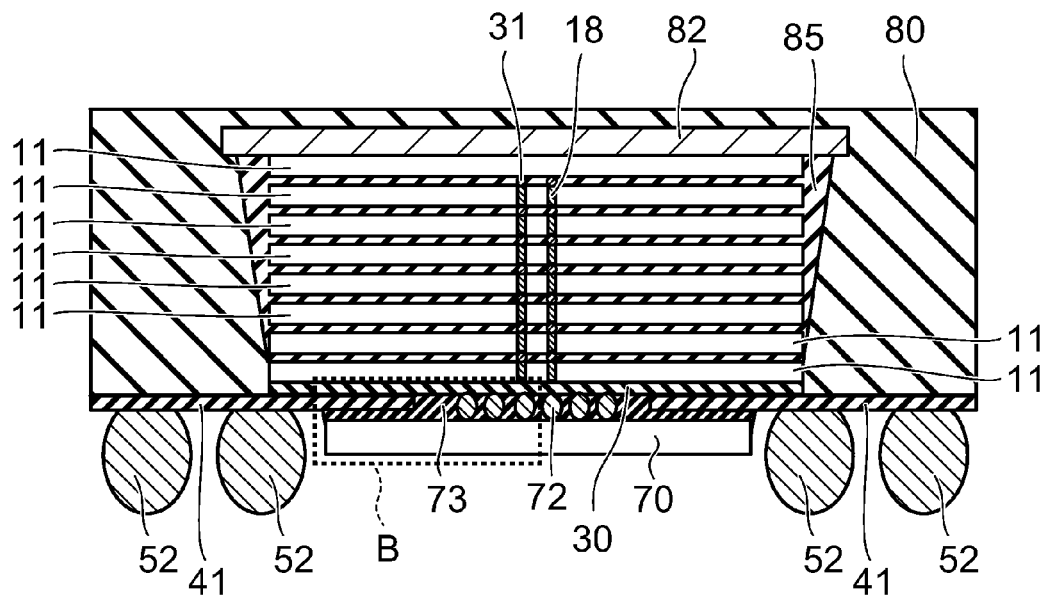
FIGS. 5A and 5B are schematic cross-sectional views of a semiconductor device of the embodiment.
Figure 5B:
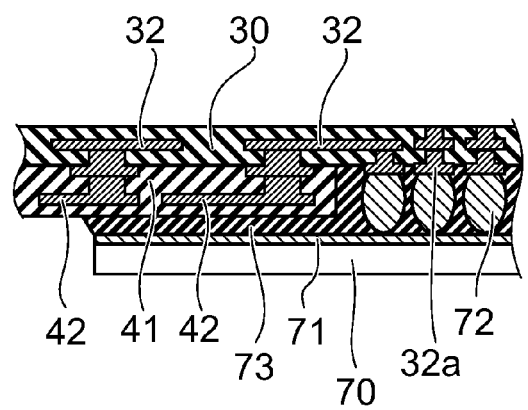

FIGS. 5A and 5B are schematic cross-sectional views illustrating yet another example of semiconductor device according to an embodiment. FIG. 5B is an enlarged schematic cross-sectional view of the part B in FIG. 5A. The configuration of the first resin layer 30, the first interconnect layer 32, the second resin layer 41, the second interconnect layer 42, and the like is the same as in the embodiments previously described.

According to the semiconductor device illustrated in FIGS. 5A and 5B, the logic chip 70 is a large multi-pin chip having, for example, a system on a chip (SOC) structure, and a portion of the logic chip 70 overlaps the second resin layer 41 and the second interconnect layer 42 in plan view. In other words, the plan size of the logic chip 70 is greater than the area of the mounting region of the logic chip 70 (opening of the second resin layer 41). The sealing resin 73 is interposed between the logic chip 70 and the second resin layer 41.

Figure 15A:
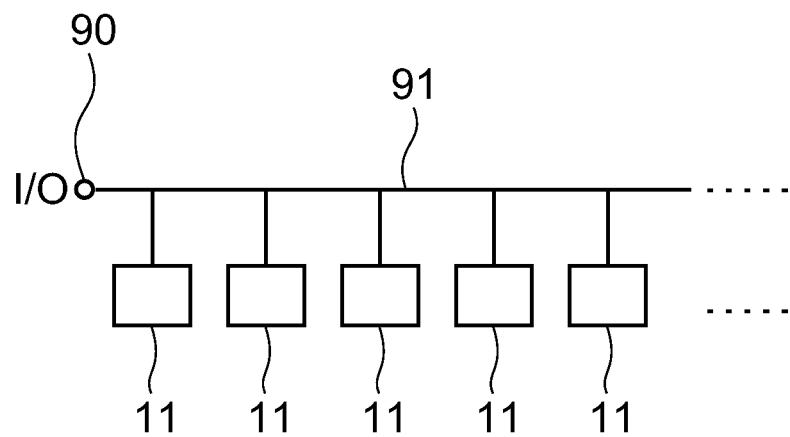
FIGS. 15A and 15B are schematic views of a relation of connection of a plurality of chips in the semiconductor device of the embodiment.

In the embodiments illustrated in FIGS. 2, 3A, 5A, and 5B, the plurality of memory chips 11 is connected in parallel (bus connection) to a common data input/output terminal 90, as illustrated in FIG. 15A. In other words, the plurality of chips 11 is connected in parallel to a common data bus 91 formed in the chip stacking direction by the through electrodes, bumps, and the like.

Figure 15B:
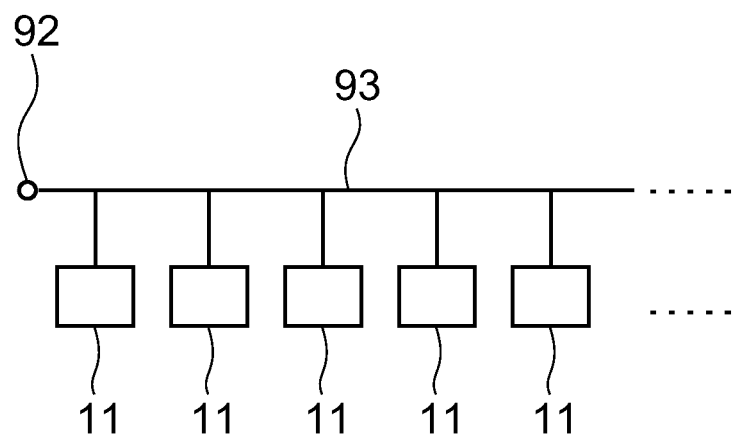

Also, as illustrated in FIG. 15B, the plurality of memory chips 11 is connected in parallel to a bus 93 to which a terminal 92 of the logic chip 70 is connected.

Next, a description is provided for a manufacturing method of a semiconductor device of an embodiment with reference to FIGS. 6A to 8C. In FIGS. 6A to 8C, a stacked body of a plurality of memory chips 11 is illustrated as the memory chip portion, but there may be only one memory chip 11.

The plurality of memory chips 11 is stacked on the metal plate 82. The first resin layer 30 and the first interconnect layer 32 are formed on the topmost memory chip 11 of the plurality of memory chips 11 on the metal plate 82.

Figure 6A:
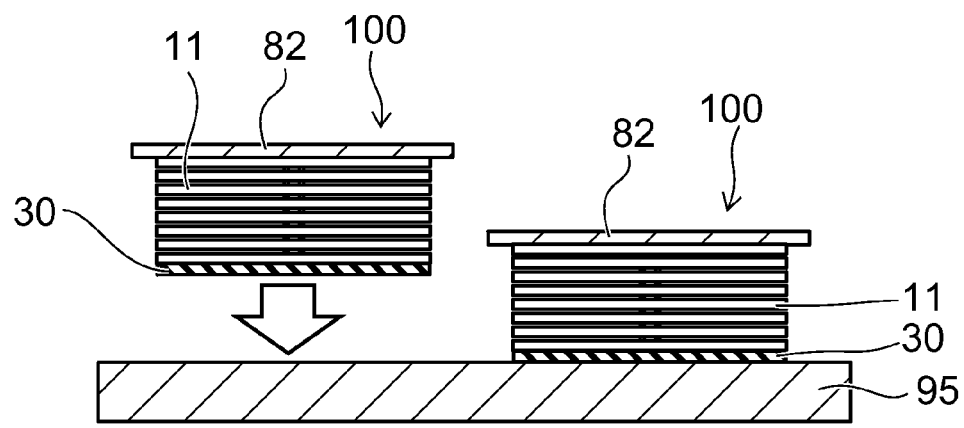
FIG. 6A to FIG. 14 are schematic cross-sectional views showing a method for manufacturing the semiconductor device of the embodiment.
Figure 6B:
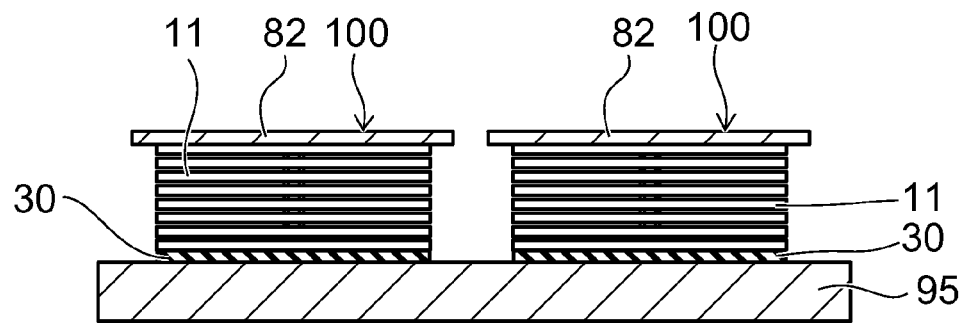

A stacked body 100 that includes the metal plate 82, the plurality of memory chips 11, the first resin layer 30, and the first interconnect layer 32 are placed on a support body 95 as illustrated in FIGS. 6A and 6B. The plurality of stacked bodies 100 is placed on the support body 95, with each of the stacked bodies 100 separated from each other. The stacked body 100 is placed on the support body 95 with the first resin layer 30 facing downward (toward the support body 95 side).

Figure 6C:
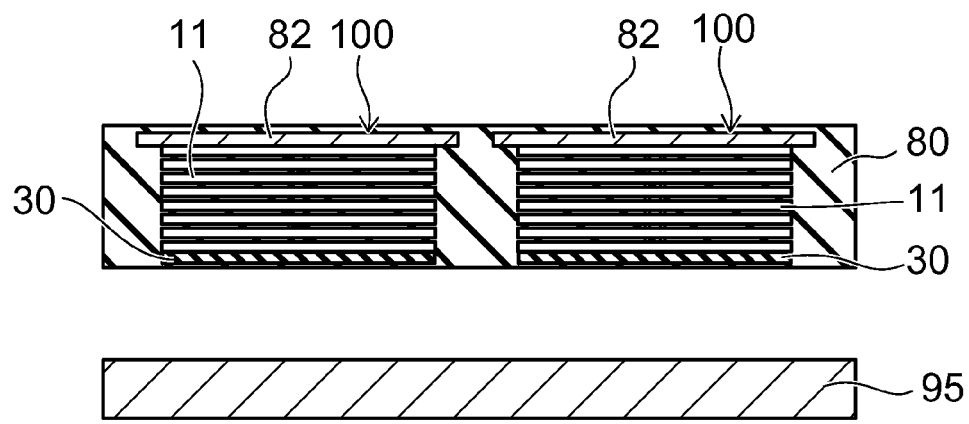

Next, as illustrated in FIG. 6C, the stacked body 100 on the support body 95 is molded in resin 80, and removed from the support body 95.

Figure 7A:
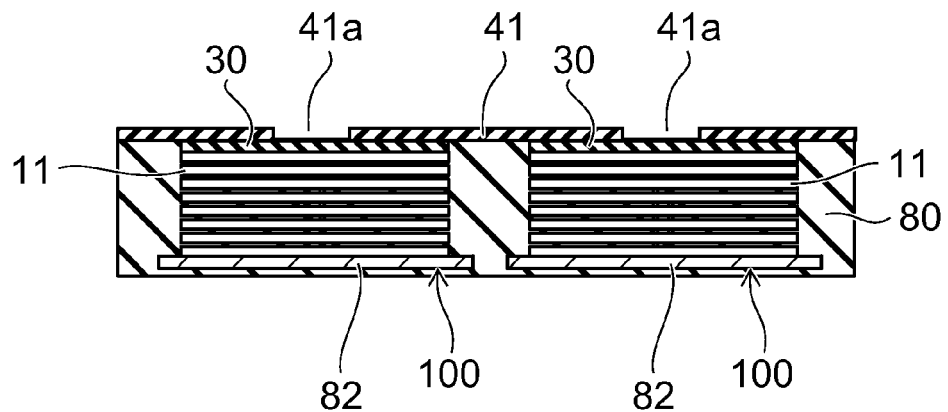

Next, as illustrated in FIG. 7A, the second resin layer 41 and the second interconnect layer 42 are formed on the first resin layer 30 and on the resin 80 in the region outside the chip (the region between adjacent stacked bodies 100). Also, an opening 41a is formed in the second resin layer 41 in a region directly above the chip, and the first resin layer 30 and the connection lands 32a of the first interconnect layer 32 (illustrated in FIG. 1) are exposed from the opening 41a.

Figure 7B:
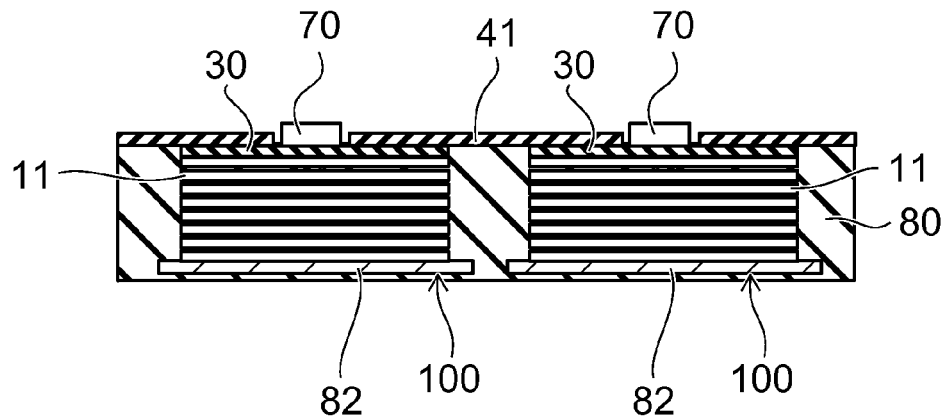
Figure 7C:
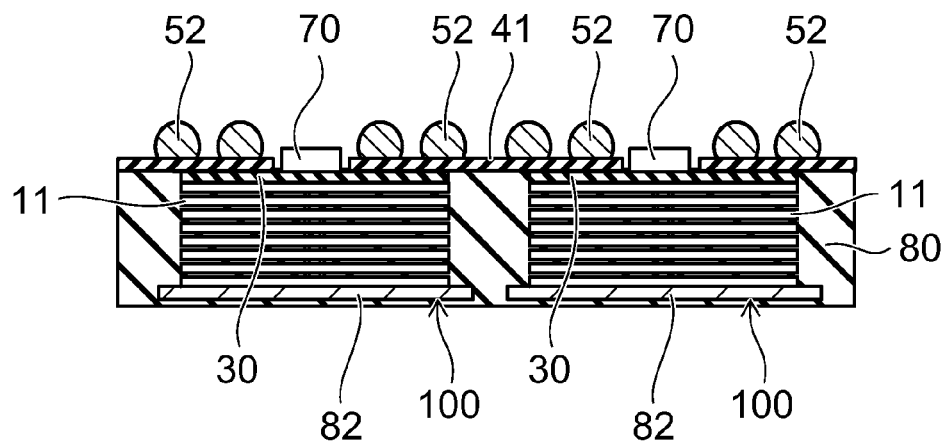

Then, the logic chips 70 are mounted on the first resin layer 30 of the opening 41a, as illustrated in FIG. 7B. The logic chips 70 are connected to the connection lands 32a of the first interconnect layer 32, via the bumps 72 illustrated in FIG. 1.

After the logic chips 70 are mounted, the plurality of external terminals 52 is formed on the second resin layer 41. The plurality of external terminals 52 is disposed in, for example, grid form on the second resin layer 41. The external terminals 52 are connected to the external connection lands 42a (illustrated in FIG. 1) of the second interconnect layer 42.

Then, the second resin layer 41 and the sealing resin 80 in the region between adjacent stacked bodies 100 are cut, to obtain a plurality of separated semiconductor devices.

Figure 8A:
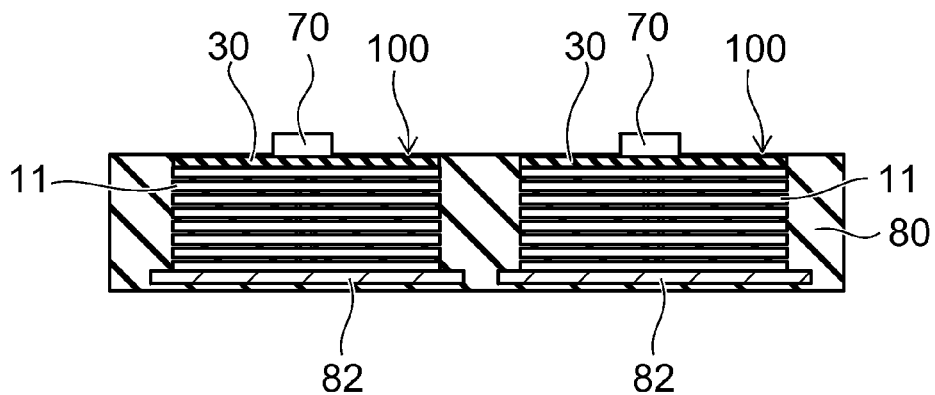

Also, after the process of FIG. 6C and before the second resin layer 41 is formed, the logic chips 70 may be placed on the first resin layer 30, as illustrated in FIG. 8A.

Figure 8B:
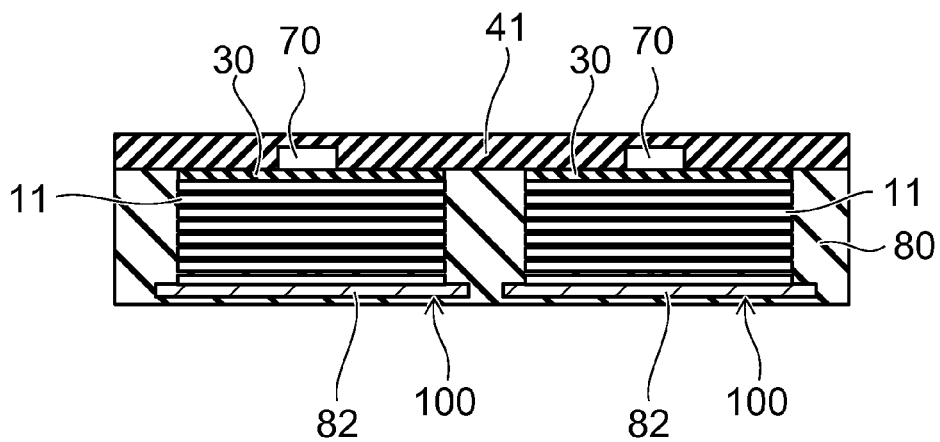

Then, as illustrated in FIG. 8B, the second resin layer 41 is formed over the first resin layer 30 and over the resin 80 in the region outside the chip (the region between adjacent stacked bodies) so as to cover the logic chip 70.

The vias are formed in the second resin layer 41 using, for example, a laser, into which the second interconnect layer 42 is embedded.

Figure 8C:
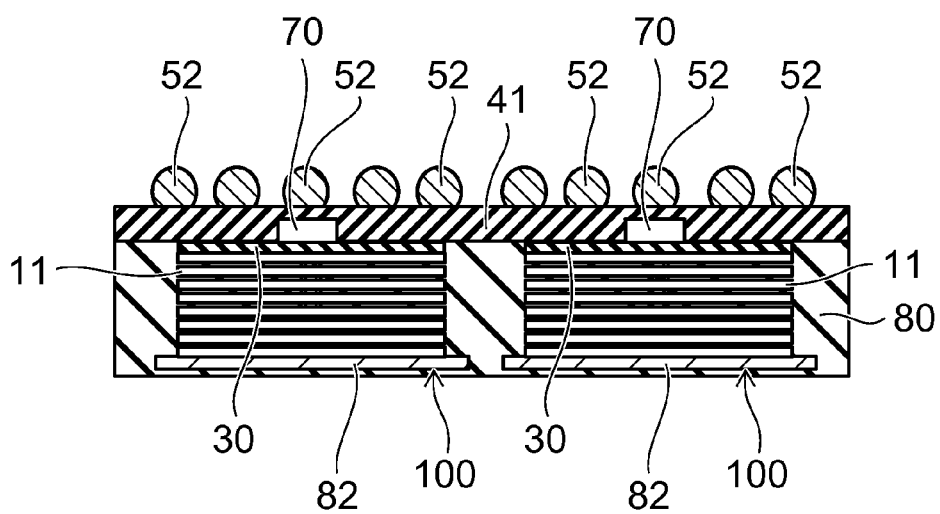

Then, as illustrated in FIG. 8C, the plurality of external terminals 52 is formed on the second resin layer 41. The external terminals 52 can also be disposed in a region that overlaps with the logic chips 70. Therefore, compared with the structure illustrated in FIG. 7C, the region in which the plurality of external terminals 52 can be disposed is widened, and the degree of freedom of disposing the external terminals 52 is increased.

Then, the second resin layer 41 and the sealing resin 80 in the region between adjacent stacked bodies 100 are cut, to obtain a plurality of separated semiconductor devices.

According to the semiconductor device of this embodiment, the plurality of memory chips is connected in parallel to a common data input/output terminal. Also, the plurality of memory chips is connected in parallel to a bus connected to the logic chip.

Also, according to the method for manufacturing the semiconductor device of this embodiment, after forming the second resin layer on the first resin layer, openings exposing the first resin layer are formed in the second resin layer, and a lower layer chip is disposed in the openings. Also, according to the method for manufacturing the semiconductor device of this embodiment, after mounting the lower layer chip on the first resin layer, the second resin layer is formed on the first resin layer so as to cover the lower layer chip.

Figure 16:
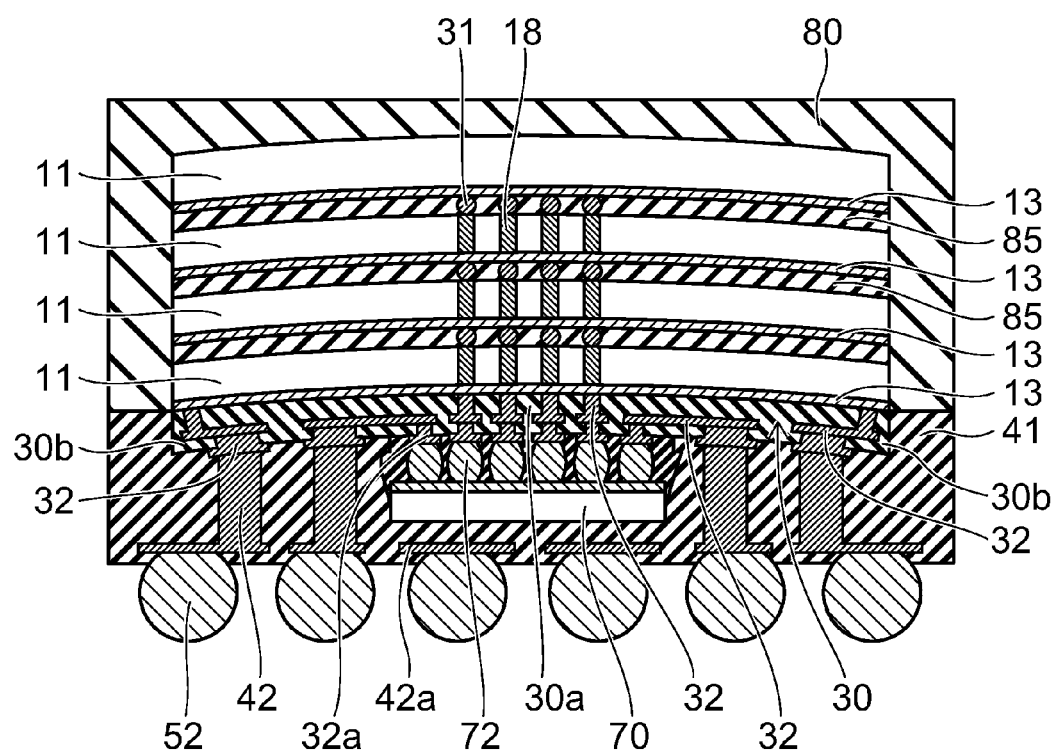
FIG. 16 is a schematic cross-sectional view of a semiconductor device of the embodiment.

FIG. 16 is a schematic cross-sectional view of another semiconductor device according to the embodiment.

The upper layer chip shown in FIG. 16 includes a stacked structure of the plurality of the memory chips 11, the same as in the embodiment shown in FIG. 2, for example. The upper layer chip has a warpage with upwardly-convexed arch in the cross-sectional view shown in FIG. 16.

The first resin layer 30 includes a periphery portion 30*b* and a central portion 30*a* with respect to a planar direction of the upper layer chip. A distance (minimal distance) between the periphery portion 30*b* of the first resin layer 30 and a bottom face of the second resin layer 41 is shorter than a distance (minimal distance) between the central portion 30*a* of the first resin layer 30 and a bottom face of the second resin layer 41.

A distance (minimal distance) between a lower end of the first interconnect layer 32 provided at a periphery region of the upper layer chip in the planar direction and the bottom face of the second resin layer 41 is shorter than a distance (minimal distance) between a lower end of the first interconnect layer 32 provided at a central region of the upper layer chip in the planar direction and the bottom face of the second resin layer 41.

A distance (minimal distance) between the lower end of the first interconnect layer 32 provided at the periphery portion 30*b* of the first resin layer 30 and the bottom face of the second resin layer 41 is shorter than a distance (minimal distance) between the lower end of the first interconnect layer 32 provided at the central portion 30*a* of the first resin layer 30 and the bottom face of the second resin layer 41.

The periphery portion 30*b* including a side surface of the first resin layer 30 is buried in the second resin layer 41, and covered with the second resin layer 41. Therefore, connection reliability (adhesion) between the first resin layer 30 and the second resin layer 41 can be increased.

All the side surface of the first resin layer 30 may be covered with the second resin layer 41. Alternatively, a part of the side surface of the first resin layer 30 may be covered with the second resin layer 41. Even though a part of the side surface of the first resin layer 30 is covered with the second resin layer 41, connection reliability between the first resin layer 30 and the second resin layer 41 can be increased.

Figure 17A:
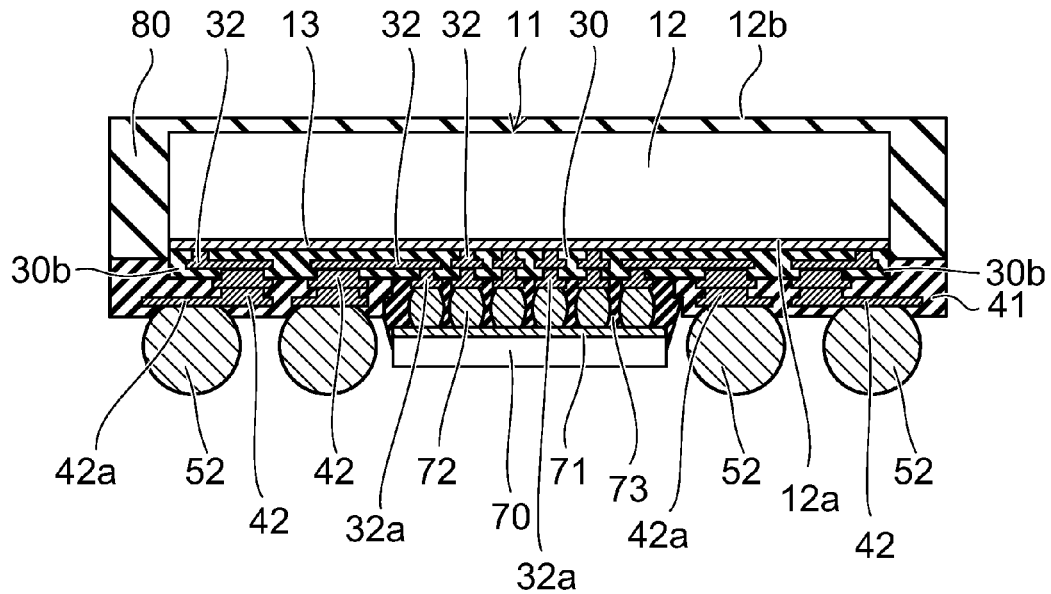
FIGS. 17A and 17B are schematic cross-sectional views of a semiconductor device of the embodiment.
Figure 17B:
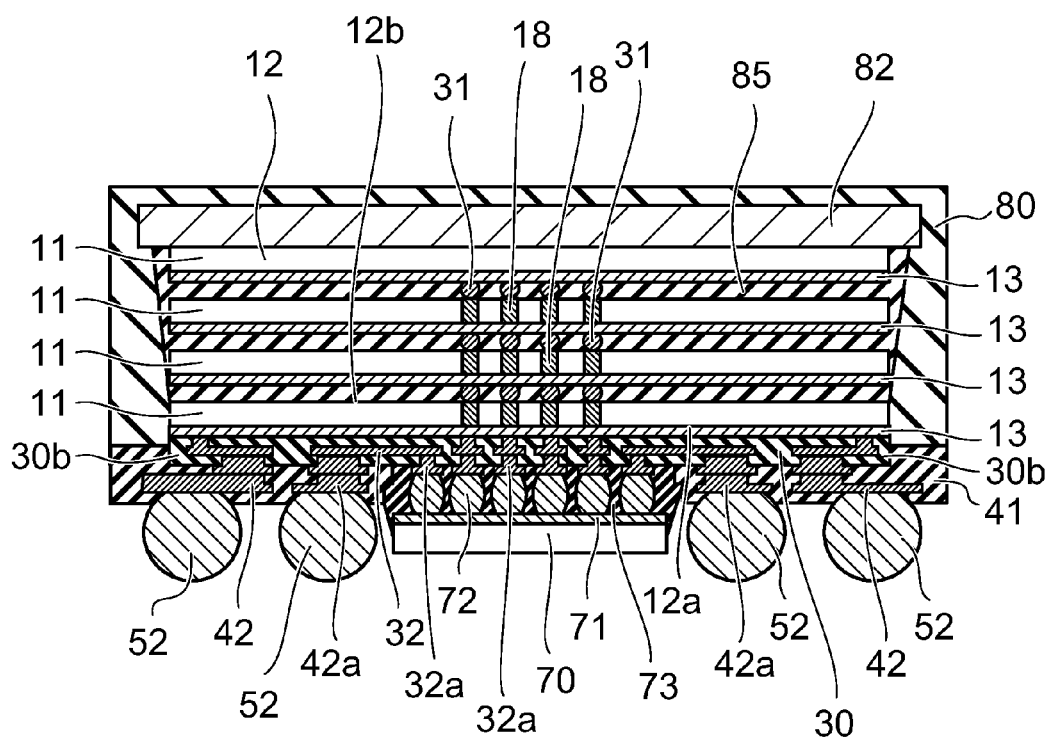

According to the embodiments shown in FIGS. 17A and 17B, a part of the side surface of the periphery portion 30*b* of the first resin layer 30 is buried in the second resin layer 41, and covered with the second resin layer 41.

In the above step of FIG. 6B, the upper layer chip is mounted on the support body 95 with the temporary bond. The first resin layer 30 is pressed against the temporary bond. And the first resin layer 30 slightly dents in the temporary bond. When the support body 95 is peeled after molding the resin 80, the first resin layer 30 slightly juts out the resin 80. When the second resin layer 41 is formed on the jut of the first resin layer 30, at least a part of the first resin layer 30 is buried in the second resin layer 41.

As the embodiment shown in FIG. 16, when the upper layer chip has warpage, the first resin layer 30 is easily buried in the second resin layer 41.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
    an upper layer chip having a first face and a second face opposite to the first face;
    a first resin layer provided on the first face of the upper layer chip;
    a first interconnect layer provided in the first resin layer, the first interconnect layer being electrically connected to the upper layer chip;
    a second resin layer provided on a surface side of the first resin layer, the second resin layer extending into a region outside the upper layer chip, and the region being outside of a side face of the upper layer chip;
    a second interconnect layer provided in the second resin layer, the second interconnect layer being connected to the first interconnect layer and extending into the region outside the upper layer chip;
    a lower layer chip mounted on the surface side of the first resin layer and connected to the first interconnect layer; and
    a first sealing resin covering the upper layer chip,
    wherein a side surface of the first resin layer is substantially aligned with and is substantially coplanar with a side surface of the upper layer chip in a direction crossing the first face and the second face.

2. The device according to claim 1, wherein the lower layer chip is disposed in an opening formed in the second resin layer.

3. The device according to claim 2, wherein a second sealing resin is provided in the opening of the second resin layer, and the second sealing resin is in contact with the second resin layer.

4. The device according to claim 1, wherein the second resin layer covers the lower layer chip.

5. The device according to claim 1, further comprising external terminals provided on a surface side of the second resin layer, the external terminals being connected to the second interconnect layer.

6. The device according to claim 5, wherein a minimum pitch of a connection portion between the lower layer chip and the first interconnect layer is less than a minimum pitch of the external terminals.

7. The device according to claim 5, wherein the second resin layer covers the lower layer chip, and the external terminals are also provided at a region in which the second resin layer covers the lower layer chip.

8. The device according to claim 1, wherein a minimum pitch of a connection portion between the lower layer chip and the first interconnect layer is less than a minimum pitch of a connection portion between the first interconnect layer and the second interconnect layer.

9. The device according to claim 1, wherein, in plan view, the lower layer chip overlaps the second interconnect layer.

10. The device according to claim 1, wherein the upper layer chip includes a memory chip and the lower layer chip includes a logic chip.

11. The device according to claim 10, wherein the upper layer chip includes a stacked body of a plurality of memory chips.

12. The device according to claim 11, wherein the plurality of memory chips include:
   a first chip including a first semiconductor layer, a first on-chip interconnect layer, and a first through electrode, the first semiconductor layer having a first circuit face and a first reverse face opposite the first circuit face, the first on-chip interconnect layer being provided on the first circuit face, and the first through electrode penetrating the first semiconductor layer and being connected to the first on-chip interconnect layer; and
   a second chip stacked onto the first on-chip interconnect layer side of the first chip, the second chip including a second semiconductor layer, a second on-chip interconnect layer, and a second through electrode, the second semiconductor layer having a second circuit face facing the first on-chip interconnect layer and a second reverse face opposite the second circuit face, the second on-chip interconnect layer being provided on the second circuit face and being connected to the first on-chip interconnect layer of the first chip, and the second through electrode penetrating the second semiconductor layer and being connected to the second on-chip interconnect layer.

13. The device according to claim 12, wherein the plurality of memory chips further include a third chip stacked on the second reverse face side of the second chip, the third chip including a third semiconductor layer, a third interconnect layer, and a third through electrode, the third semiconductor layer having a third circuit face and a third reverse face opposite the third circuit face and facing the second chip, the third interconnect layer being provided on the third circuit face, the third through electrode penetrating the third semiconductor layer, and the third through electrode being connected to the third interconnect layer and being connected to the second through electrode of the second chip via a bump.

14. The device according to claim 11, wherein the plurality of memory chips are connected in parallel to a common data input/output terminal.

15. The device according to claim 11, wherein the plurality of memory chips are connected in parallel to a bus, the logic chip being connected to the bus.

16. The device according to claim 11, further comprising an inter-chip sealing resin provided between the plurality of memory chips.

17. The device according to claim 11, wherein the plurality of memory chips are connected via conductive bumps.

18. The device according to claim 1, wherein the first interconnect layer does not extend into the region outside the upper layer chip.

19. The device according to claim 1, wherein a distance between a lower end of the first interconnect layer provided at a periphery region of the upper layer chip and a bottom face of the second resin layer is shorter than a distance between a lower end of the first interconnect layer provided at a central region of the upper layer chip and the bottom face of the second resin layer.

20. The device according to claim 1, wherein at least a part of a periphery portion of the first resin layer is covered with the second resin layer.

21. The device according to claim 1, wherein the first interconnect layer is electrically connected to the upper layer chip without a bump.

* * * * *